United States Patent [19]

Gulczynski

[11] Patent Number: 4,843,392
[45] Date of Patent: Jun. 27, 1989

[54] DIGITAL-TO-ANALOG CONVERTER WITH DIGITAL CORRECTION

[76] Inventor: Zdzislaw Gulczynski, P.O. Box 441, Winchester, Mass. 01890

[21] Appl. No.: 177,864

[22] Filed: Mar. 23, 1988

Related U.S. Application Data

[63] Continuation of Ser. No. 858,701, May 2, 1986.

[30] Foreign Application Priority Data

May 3, 1985 [DE] Fed. Rep. of Germany ....... 3516005

[51] Int. Cl.[4] .............................................. H03M 1/66
[52] U.S. Cl. .................................... 341/145; 341/118
[58] Field of Search ............... 341/144, 145, 148, 118, 341/131, 138, 153

[56] References Cited

U.S. PATENT DOCUMENTS

| | | | |
|---|---|---|---|
| 4,070,665 | 1/1978 | Glennon et al. | 341/115 |
| 4,465,996 | 8/1984 | Boyacigiller et al. | 341/118 |
| 4,503,421 | 3/1985 | Hareyama et al. | 341/145 |
| 4,523,182 | 6/1985 | Harvey et al. | 341/118 |

FOREIGN PATENT DOCUMENTS

| | | | |
|---|---|---|---|
| 2427011 | 1/1980 | France | 340/347 DA |
| 0201327 | 12/1982 | Japan | 340/347 DA |

*Primary Examiner*—William M. Shoop, Jr.
*Assistant Examiner*—Helen Goh

[57] ABSTRACT

A true N-bit digital-to-analog converter (DAC), i.e. a DAC the absolute accuracy error of which is less than 1 LSB (or $\pm\frac{1}{2}$ LSB), can be composed of easy obtainable and low-priced components. The DAC distinguishes a very fast, highly accurate, high resolution conversion of a digital input code into an equivalent voltage or current.

Two or more DACs are cascaded in order to attain a high resolution. Only one ROM and an associated DAC are necessary to obtain an accuracy error of less than 1 LSB, in consequence of the increased resolution. The final trimming can be conducted in packaged form of the device through the ROM programming.

For example, a true 16-bit DAC can be composed of three equal true 8-bit DACs, wherein their absolute accuracy error must be less than 0.992 LSB. A ROM with the storage capacity of only 256 bytes is necessary.

6 Claims, 1 Drawing Sheet

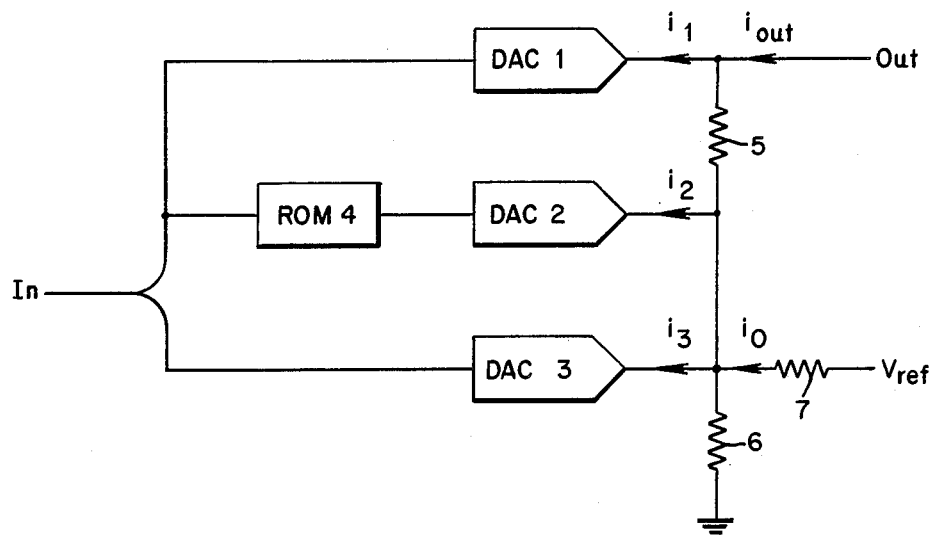

DIGITAL-TO-ANALOG CONVERTER WITH DIGITAL CORRECTION

This application is a continuation of prior application Ser. No. 858,701 filed on 05/02/86 and entitled "Digital-to-Analog Converter", by the same inventor.

CROSS REFERENCE TO RELATED INVENTIONS

This application is related to:
"Ultra Fast High Resolution Digital-to-Analog Converter" Ser. No. 304,507 filed 01/31/89;
"Encoder and Digital Memory for Flash Analog-to-Digital Converters" Ser. No. 304,506 filed 01/31/89;
"High Accuracy Reference Ladder" Ser. No. 304,510 filed 01/31/89;
"Flash Analog-to-Digital Converter with Integrating Input Stage" Ser. No. 248,495 filed 09/22/88;
"Encoder for Flash Analog-to-Digital Converters" Ser. No. 225,240 filed 07/28/88;
"High Speed Integrating Digital-to-Analog Converter" Ser. No. 198,110 filed 05/23/88;
"Digital-to-Analog Converter" U.S. Pat. No. 4,881,017 dated 03/07/89; and
"Digital-to-Analog Converter" Ser. No. 075,450 filed 07/20/87.
All inventions are by the same inventor.

The enclosed specification and drawing have been amended in accordance with the Amendments dated 04-03-1987 and 09-28-1987, and entered by the Examiner. A new set of claims is submitted herewith.

BACKGROUND AND SUMMARY OF THE INVENTION

The invention relates to a digital-to-analog converter (DAC) with a ROM (Read Only Memory) correction, particularly for digital systems requiring high speed, high accuracy and high resolution conversion of a digital input code into a corresponding analog voltage or current.

A true N-bit DAC is able to associate with each of its $2^N$ input codes a corresponding output voltage or current, namely with an absolute accuracy error, in following called in short accuracy error, of less than 1 LSB (or $\pm\frac{1}{2}$ LSB).

The conventional true N-bit DACs with ROM correction employ a DAC with N-bit resolution. A number of the most significant bits of the input code are applied to the ROM. The outputs thereof are connected to inputs of a correction DAC. The outputs of the DACs are connected directly, whereby the accuracy error is reduced. The final trimming is conducted in packaged form of the device through the ROM programming.

The results of this method are questionable. The initial accuracy error must be small because the correction improves it just slightly. A special correction DAC must be employed because the added output currents are equally weighted due to the direct coupling of the outputs of the DACs.

The invention is intended to provide a true N-bit DAC having a very high resolution. According to the invention a DAC with a ROM correction solves this problem, as outlined in claim 1.

The circuit consists of easy obtainable and low-priced components. No interference into the internal structure of the employed DACs is required, on the contrary to the conventional methods. The conversion speed is very high. A correction of the temperature drift can be undertaken; the operating temperature range can be extended.

The output of an ordinary DAC can be presented as controllable current source, whereby the current depends on the input code. A following amplifier may convert the output current of the DAC into an appropriate voltage.

For simplicity, an unipolar operation of the individual DACs is assumed. To unipolar DACs applies:

$$i_{out}/i_{ref} = d_N/2^N + e_N/2^N,$$

where $i_{out}$ is the output current of the DAC. $i_{ref}$ is the full scale current and is equal to $V_{ref}/R$; usually a reference voltage source is employed for providing the current $i_{ref}$ flowing through a fixed resistor R.

The decimal number $d_N$ is equal to the value of the binary code of the DAC and ranges from 0 to $2^N-1$. Thus $d_N$ has $2^N$ different values. N is the resolution of the DAC.

The individual deviations $e_N$ of the output current $i_{out}$ from the nominal value depend basically on the input code of the DAC. Their exact values as well as their sources such as e.g. temperature, noise, tolerance of the components, do not matter by itself alone. The biggest deviation determines the accuracy error and, for true N-bit DACs, must be greater than or equal to 0 and less than 1.

BRIEF DESCRIPTION OF THE DRAWING

The present invention will become more clear in conjunction with the accompanying FIGURE which shows an embodiment of a high resolution true N-bit DAC. The circuit consists essentially of a true K-bit DAC 1 and two true L-bit DACs 2 and 3, wherein $K+L=N$.

DETAILED DESCRIPTION OF THE INVENTION

Assuming usual sink output currents $i_1$, $i_2$ and $i_3$ of the DACs 1, 2 and 3 respectively, following equation applies to the output current of the entire circuit $i_{out}$:

$$i_{out}/i_{ref} = $$
$$(i_1 + (i_2 + i_3 - i_0)/2^K)/i_{ref} = $$
$$d_{1K}/2^K + d_{3L}/2^N + (d_{2L} + E_N - y)/2^N,$$

where $i_0$ is a constant current and $i_1$, $i_2$ and $i_3$ are shown as unidirectional by the arrows in the FIGURE. For that purpose a current source can be used or, as in the embodiment of the invention, the resistor 7 applied between the reference voltage source and the outputs of the DACs 2 and 3. The connection of the resistor 7 directly to the output of the circuit would cause its higher value. The parameter $y = 2^L i_0/i_{ref}$. The current $i_2 + i_3 - i_0$ is divided by $2^K$ in the current divider consisting of the resistors 5 and 6 to thereby weight the output currents from the DACs 2 and 3.

$E_N$ represents the total accuracy error of the DACs 1, 2 and 3, wherein $$E_N = 2^L e_{1K} + e_{2L} + e_{3L}.$$

Assuming that $E_N$ is always less than $2^L$, or each partial error is less than $2^L/(2^L+2)$, and $y = 2^L - 1$ then for every value $d_{1K}$ and $d_{3L}$ a value $d_{2L}$ can be found so that the accuracy error of the entire circuit is less than $\frac{1}{2}^N$ or 1 LSB. The ROM 4 is employed for that purpose. It is programmed in such a manner that the necessary dependence $d_{2L}$ upon $d_{1K}$ is established. The circuit built in such a way presents thus a true N-bit accurate DAC, wherein $N=K+L$.

The N-bit input code of the entire circuit is divided in two codes which contain K most and L least significant bits of the input code, wherein $N=K+L$. The codes are applied to the DAC 1 and the ROM 4 (K bits) and to the DAC 3 (L bits) respectively. The DAC 2 is further connected to the ROM 4, i.e. the ROM 4 provides K inputs and L outputs. The DAC 3 is superfluous if a DAC with K-bit resolution and $\frac{1}{2}^N$ accuracy error is needed. For instance, such DACs are used in Dual-Flash Analog-to-Digital Converters. The circuitry of the true N-bit DAC designed according to the invention can also be considered in a different way. DAC 1 and 3 are cascaded in order to attain an N-bit resolution. The ROM 4 with the associated DAC 2 reduce the accuracy error of the DAC 1 $2^L$ times so that the final accuracy error is less than 1 LSB.

A true K- or L-bit DAC can be accomplished by connecting a ROM followed by a DAC, in a similar fashion as ROM 4 and DAC 2. The ROM can be programmed in such a manner that the output current of the entire circuit exhibits a reduced accuracy error, in particular offset, gain and linearity error. Only a part of the input code can be applied to the inputs of the ROM.

Similarly, a thermal member providing a digital output can be connected to a ROM having an increased number of the input terminals, in order to reduce the thermal coefficient of the accuracy error of the entire circuit. In a simplest case, a thermal switch can be used.

For example, a true 16-bit DAC can be composed of three true 8-bit DACs. Their accuracy error must be less than 0.992 LSB. The error must be smaller accordingly due to the tolerance of the resistors 5 and 6 as well as the current $i_0$. The storage capacity of the ROM comes to 256 bytes.

A true 20-bit DAC can be composed of one 12-bit and two 8-bit true DACs. For that purpose two 8-bit, one 4-bit and one 12-bit true DACs can be employed as well. The resistor network, 5, 6 and 7, must be completed by at least one resistor in order to obtain an appropriate weight of the output currents of the DACs. It is recommendable to employ two ROMs.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Digital-to-analog converter having output, for converting digital input code, having most and least significant bits, into analog output signal, comprising:
    a first digital-to-analog converter means coupled to the output of the digital-to-analog converter for converting the most significant bits into a first current;
    a programmable memory means for converting the most significant bits into a digital correction code;
    a second digital-to-analog converter means having an output, for converting the digital correction code into a second current;
    a third digital-to-analog converter means coupled to the output of the second digital-to-analog converter means for converting the least significant bits into a third current,
    wherein the first, second and third currents have essentially equal weights;
    a source means for providing a fourth current; and
    a resistive means for coupling the output of the second digital-to-analog converter means and the source means to the output of the digital-to-analog converter.

2. Digital-to-analog converter of claim 1 wherein absolute accuracy errors of each the first, second and third digital-to-analog converter means are less than one least significant bit of the respective codes applied thereto, and
    further wherein the programmable memory means is programmed in such a manner that the absolute accuracy error of the digital-to-analog converter is less than one least significant bit of the digital input code.

3. Digital-to-analog converter of claim 1 wherein the digital input code has L least significant bits, and
    further wherein the digital correction code has L bits.

4. Digital-to-analog converter of claim 1 wherein the digital input code has K most significant bits,
    further wherein the resistive means includes a node coupled to the output of the second digital-to-analog converter means and a fifth current is flowing to the node, and
    still further wherein the fifth current is divided by $2^K$ in the resistive means.

5. Digital-to-analog converter of claim 1 wherein the first, second and third currents are equally polarized and unidirectional.

6. Digital-to-analog converter of claim 1 wherein the source means includes a voltage source and a resistor coupled in series therewith.

* * * * *